(12) United States Patent
Mack

(10) Patent No.: US 7,061,278 B1
(45) Date of Patent: Jun. 13, 2006

(54) DIFFERENTIAL NARROWBAND PEAK DETECTOR

(75) Inventor: Michael Mack, Sunnyvale, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 0 days.

(21) Appl. No.: 10/957,472

(22) Filed: Sep. 30, 2004

Related U.S. Application Data

(60) Provisional application No. 60/550,000, filed on Mar. 3, 2004.

(51) Int. Cl.
*G01R 19/00* (2006.01)
(52) U.S. Cl. .......................................... 327/58; 327/62
(58) Field of Classification Search ................. 327/58, 327/61, 62
See application file for complete search history.

(56) References Cited

U.S. PATENT DOCUMENTS 5,804,993 A * 9/1998 Suzuki ........................ 327/58

6,836,156 B1 * 12/2004 Chien .......................... 327/58
6,977,531 B1 * 12/2005 Chien .......................... 327/62

* cited by examiner

*Primary Examiner*—Long Nguyen
(74) *Attorney, Agent, or Firm*—Bever, Hoffman & Harms, LLP; Jeanette S. Harms

(57) ABSTRACT

A single-ended peak detector is typically used to determine the peak of a differential RF signal. This single-ended peak detector cannot accurately measure the peak because of the common mode component of the RF signal. To solve this problem, a differential peak detector is provided that is capable of accurately sensing the peaks of the differential RF signal by rejecting its common mode component. In one embodiment, the components of this differential peak detector can be duplicated and placed in a mirror configuration, wherein the positive and negative components of the differential signal can be switched for one pair of input terminals. This mirrored differential peak detector can advantageously balance impedances on its inputs and reduce filtering requirements at the output node.

7 Claims, 5 Drawing Sheets

DIFFERENTIAL NARROWBAND PEAK DETECTOR

BACKGROUND OF THE INVENTION

1. Field of the Invention

The present invention relates to a differential signal peak detector that eliminates the common mode component, thereby generating an accurate peak measurement.

2. Description of the Related Art

Radio frequency (RF) integrated circuits (ICs) are increasingly ubiquitous in the telecommunications industry. In such an RF IC, a peak detector is often used to generate a low frequency signal proportional to the amplitude of an input RF signal. Knowing the amplitude, other circuits on the RF IC can be adjusted to improve signal detection and analysis.

FIG. 1 illustrates a simple peak detector 100 including a diode 101 receiving an RF signal on its anode, a capacitor 102 coupled to the cathode of diode 101, and a resistor 103 also coupled to the cathode of diode 101 and connected in parallel to capacitor 102. In this configuration, the peaks of the RF signal can charge up capacitor 102, wherein resistor 103 can bleed off some of that charge, particularly during off peak times. Peak detector 100 operates by detecting a time varying input voltage, i.e. the RF signal, and storing charge on capacitor 102 to produce a voltage DET equal to the maximum detected input voltage.

Increasingly, RF ICs implement mixed signal designs that include both digital and analog circuits. Typically, RF IC analog circuits are differential, i.e. signals with equal magnitude and opposite phase are transmitted and processed. Using differential techniques throughout the RF IC can provide several advantages. For example, input RF signals can be made differential to increase their amplitude relative to a limited supply voltage, thereby allowing easier detection. This differential RF signal can also advantageously provide immunity to single-ended noise sources (e.g. supply noise).

Unfortunately, RF IC designers often use a single-ended peak detector, e.g. peak detector 100, for a differential RF signal and mistakenly assume that a common mode component (i.e. the sum of the differential signals divided by two) is negligible. Specifically, the RF signal frequently includes a common mode component that varies. In this case, peak detector 100 would follow the peak of that RF signal including the common mode component, thereby resulting in a varying and inaccurate peak measurement. The resulting error in the detected signal DET can undesirably decrease performance of the peak detector as well as any circuit (e.g. amplifiers) using the detected signal as an input.

Therefore, a need arises for a peak detector capable of sensing the peaks of a differential signal but rejecting its common mode component.

SUMMARY OF THE INVENTION

In accordance with one aspect of the invention, a differential peak detector is provided that is capable of accurately sensing the peaks of a differential RF signal by rejecting its common mode component. This differential peak detector can include transistors (e.g. NMOS transistors), current sources, and capacitors in the following configuration.

Specifically, a first transistor can have its drain connected to a first voltage source (e.g. VDD) and its source connected to a first node. A first current source can be connected between the first node and a second voltage source (e.g. VSS). A second transistor can have its drain and gate connected to a bias voltage (VBIAS) and its source connected to a second node. A second current source can be connected between the second node and the second voltage source. An impedance device can be connected between the gates of the first and second transistors, wherein the impedance device prevents an RF frequency from being applied to the gate of the second transistor. In one embodiment, the impedance device can include a resistor.

The differential peak detector can include two input terminals, wherein an input terminal INP receives the positive component of the differential signal and an input terminal INN receives the negative component of the differential signal. In accordance with one aspect of the invention, a first capacitor can be connected between the input terminal INP and the gate of the first transistor. A second capacitor can be connected between the input terminal INN and the first node (which is connected to the source of the first transistor).

A filter can be connected to the first node, the second voltage source, and a third node. In one embodiment, the filter can include a resistor connected between the first node and the third node as well as a third capacitor connected between the third node and the second voltage source. Therefore, the input terminal INP is AC coupled to the gate of the first transistor through the first capacitor whereas the input terminal INN is AC coupled to the source of the second transistor though the second capacitor. Notably, the second node can be connected to an output terminal providing a reference voltage, the third node can be connected to another output terminal providing a detected voltage, and a difference between the detected voltage and the reference voltage is a peak voltage.

In this configuration, a positive differential signal applied to the differential peak detector increases the gate to source voltage Vgs of the first transistor, thereby turning on the first transistor and increasing the current flowing through that transistor. This additional current charges the second capacitor and raises the voltage at the first node. In contrast, a negative differential signal applied to the differential peak detector decreases the gate to source voltage Vgs of the first transistor, thereby turning off the first transistor and decreasing the current flowing through that transistor. This reduction in current discharges the second capacitor through the first current source. After several cycles of the RF input, the voltage at the first node increases until the average current flowing in the first transistor is equal to a static current through the first current source.

In another embodiment, the above-described components can be duplicated and placed in a mirror configuration, wherein the positive and negative components of the differential signal can be switched for one pair of input terminals. Note that certain components, such as the second transistor, the second node, and the second current source, can be shared in this mirror configuration. This mirrored differential peak detector can advantageously balance impedances on its inputs.

DETAILED DESCRIPTION OF THE FIGURES

In a conventional RF IC, a single-ended peak detector is used to determine the peak of a differential RF signal. Unfortunately, this single-ended peak detector cannot accurately measure the peak because of the common mode component of the RF signal. In accordance with one aspect of the invention, a peak detector includes a circuit that is capable of accurately sensing the peaks of a differential RF signal by rejecting its common mode component.

Figure 1:
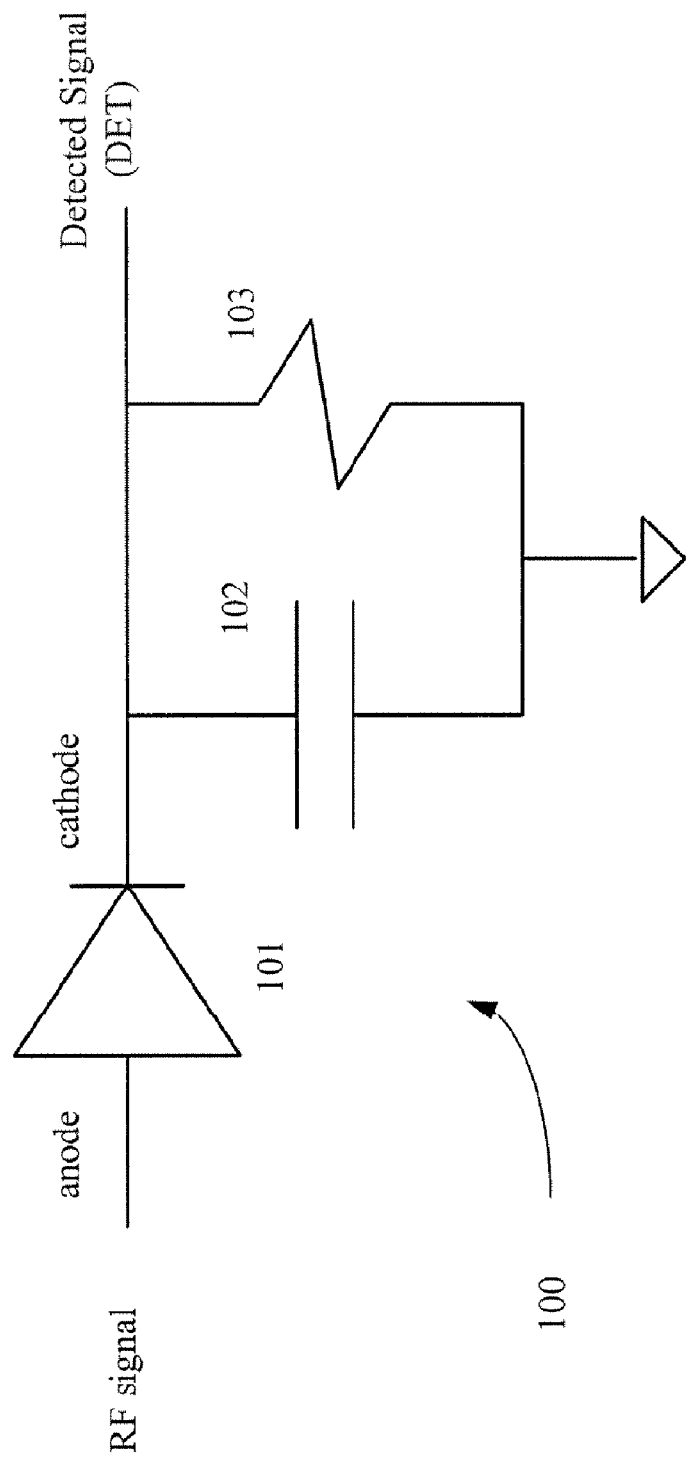
FIG. 1 illustrates a simple peak detector that does not compensate for a varying common mode component in an RF signal.
Figure 2:
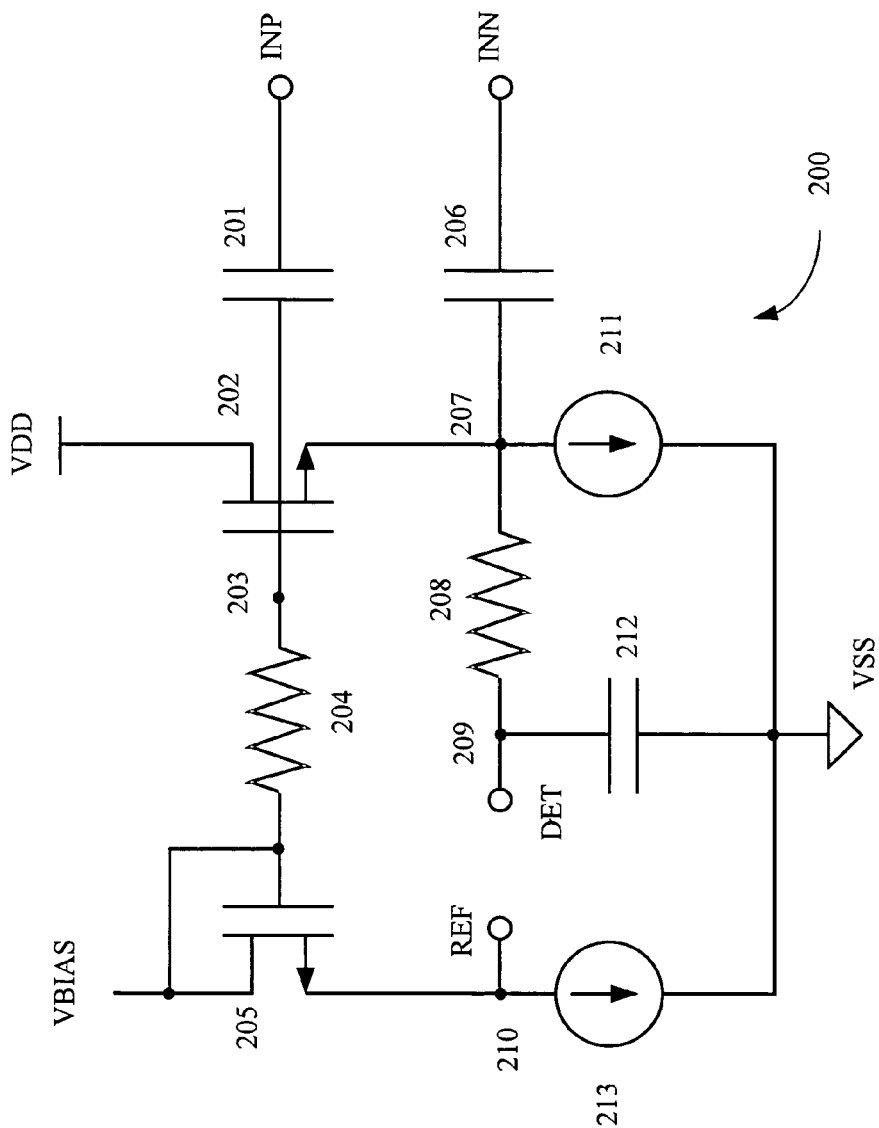
FIG. 2 illustrates a differential peak detector that can advantageously sense the peaks of a differential signal and reject any common mode component that may be present.

FIG. 2 illustrates one embodiment of a peak detector circuit 200 that can advantageously detect the difference between its differential input signal components, i.e. the positive component of the RF signal "INP" and the negative component of the RF signal "INN", and reject any common mode components that may be present.

In this embodiment, the drain of an NMOS transistor 202 can be connected to a positive voltage source VDD and the source of transistor 202 can be connected to a node 207. A current source 211 can be connected between node 207 and a low voltage source VSS. A resistor 208 is connected between node 207 and a node 209, which in turn is connected to an output terminal providing the detected signal DET. A capacitor 212 is connected between node 209 and voltage source VSS.

The drain and gate of an NMOS transistor 205 can be connected to a bias voltage VBIAS and the source of transistor 203 can be connected to a node 210, which in turn is connected to an output terminal providing a reference signal REF. A current source 213 can be connected between node 210 and voltage source VSS. In one embodiment, current sources 211 and 213 can provide the same bias current (e.g. 10 µamps). The gates of transistors 202 and 205 are connected via a resistor 204.

The positive component of the differential signal INP is provided to one plate of a capacitor 201, wherein the other plate is connected to node 203. The negative component of the differential signal INN is provided to one plate of a capacitor 206, wherein the other plate is connected to node 207. Thus, the positive component of the differential signal INP is AC coupled to the gate of transistor 202 through capacitor 201, whereas the negative component of the differential signal INN is AC coupled to the source of transistor 205 through capacitor 206.

In this configuration, a positive differential signal applied to differential peak detector 200 increases the gate to source voltage Vgs of transistor 202, thereby turning on transistor 202 and increasing the current flowing through transistor 202. This additional current charges capacitor 206 and raises the voltage at node 207. In contrast, a negative differential signal applied to differential peak detector 200 decreases the gate to source voltage Vgs of transistor 202, thereby turning off transistor 202 and decreasing the current flowing through transistor 202. This reduction in current discharges capacitor 206 through current source 211. After several cycles of the RF input, the voltage at node 207 increases until the average current flowing in transistor 202 is equal to a static current Ibias through current source 211.

Figure 3:
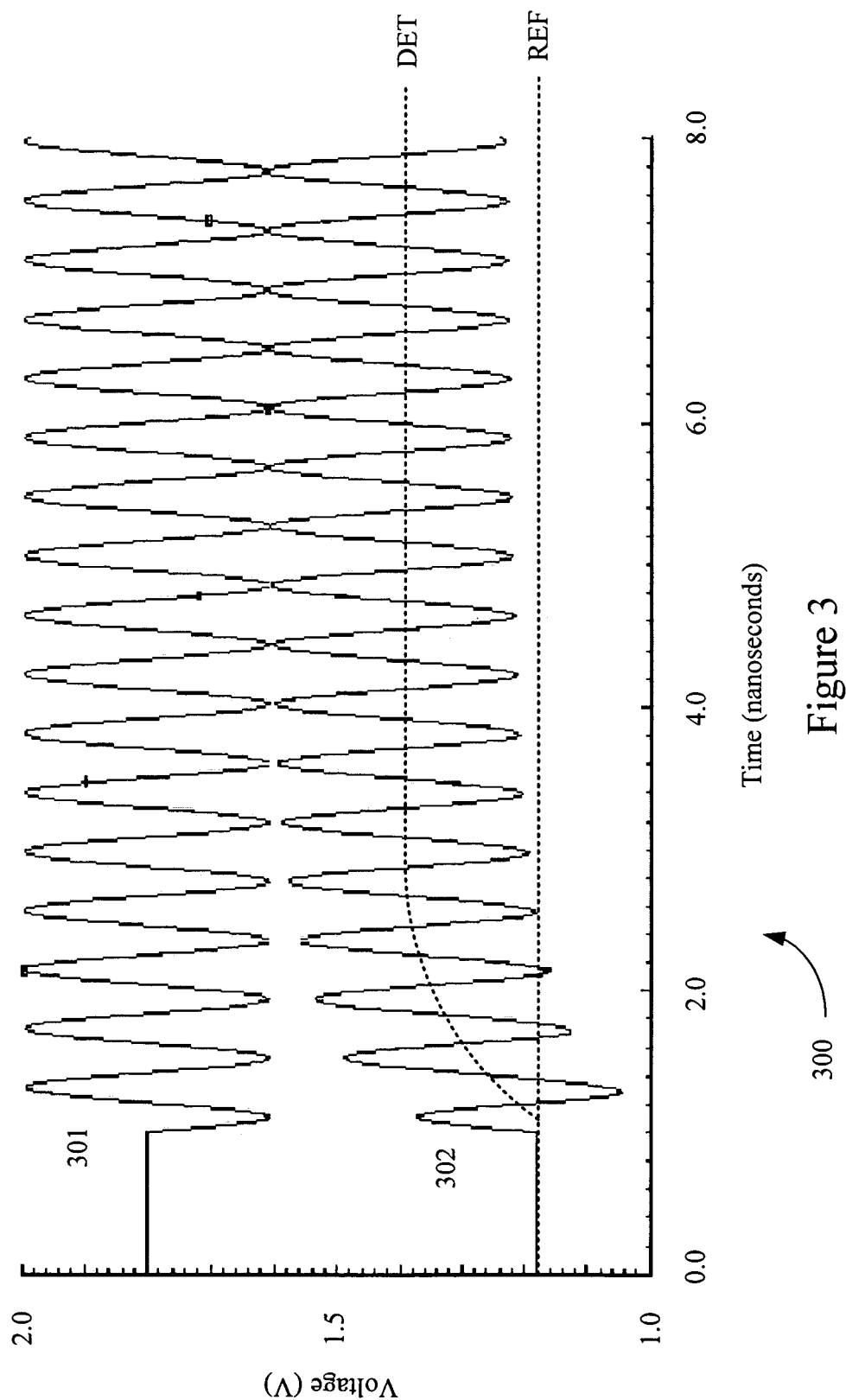
FIG. 3 illustrates the differential response of the circuit shown in FIG. 2.

FIG. 3 illustrates a graph 300 of the differential response of circuit 200 (FIG. 2). A waveform 301 corresponds to the voltage at node 203 (i.e. the gate voltage) whereas a waveform 302 corresponds to the voltage at node 207 (i.e. the source voltage).

To generate these waveforms (as well as those in FIG. 4), the following component characteristics (referring to FIG. 2) can be used. Transistors 202 and 205 can have a width of 5.0µ and a length of 0.18µ. Resistors 204 and 208 can have a resistance of 10 k Ohms and 100 k Ohms, respectively (wherein resistor 208 could be formed as a long, narrow polysilicon resistor, a diffusion resistor, or a well resistor). Capacitors 201 and 206 (e.g. implemented as metal finger capacitors or any other type of capacitor having an "always on" characteristic) can have a capacitance of 1 picofarad (appropriate for a low frequency signal, or reduced for a high frequency signal) to ensure that all (or substantially all) of signal INP is provided to the gate of transistor 203. Capacitor 212 can also have a capacitance of 1 picofarad (note that capacitor 212 could be implemented with an NMOS transistor having its gate connected to the output terminal and its source/drain/bulk connected to ground, wherein such device could provide 10 picofarads of capacitance). In this embodiment, voltage source VDD and VBIAS can provide 1.8 V.

Note that before the differential RF signal is applied, the gate to source voltage of transistor 202 is that required to support the static current Ibias of current source 211 (likewise for transistor 205 and current source 213). Further note that when the differential RF signal is applied, the DC value of the gate voltage, indicated by waveform 301, remains the same. At the same time, the DC value of the source voltage increases, which is shown by waveform 302. Specifically, the voltage at node 207 increases until the average current flowing through transistor 202 equals the static current Ibias.

This increased voltage can be filtered and then detected at the output terminal as signal DET. An exemplary filtered detected signal DET and reference signal REF are shown superimposed on graph 200 for clarification. Note that using a higher order filter can reduce any ripples (not shown) that could be present in the detected signal DET.

The change in the frequency value of Vgs in transistor 202 can be filtered and sensed by using a bias circuit. Referring back to FIG. 2, resistor 208, capacitor 212, and transistor 205 can provide this filtering and sensing. Specifically, at very low frequencies (e.g. DC), capacitor 212 functions like an open circuit and no current flows through resistor 208. In contrast, at very high frequencies, capacitor 212 functions like a short circuit and some current does flow through resistor 208. Therefore capacitor 212 and resistor 208 under high frequency conditions provide an impedance divider. However, because of its very low impedance, capacitor 212 effectively shunts the high frequency components to ground. The peak voltage is the difference between the detected signal DET and the reference signal REF.

Figure 4:
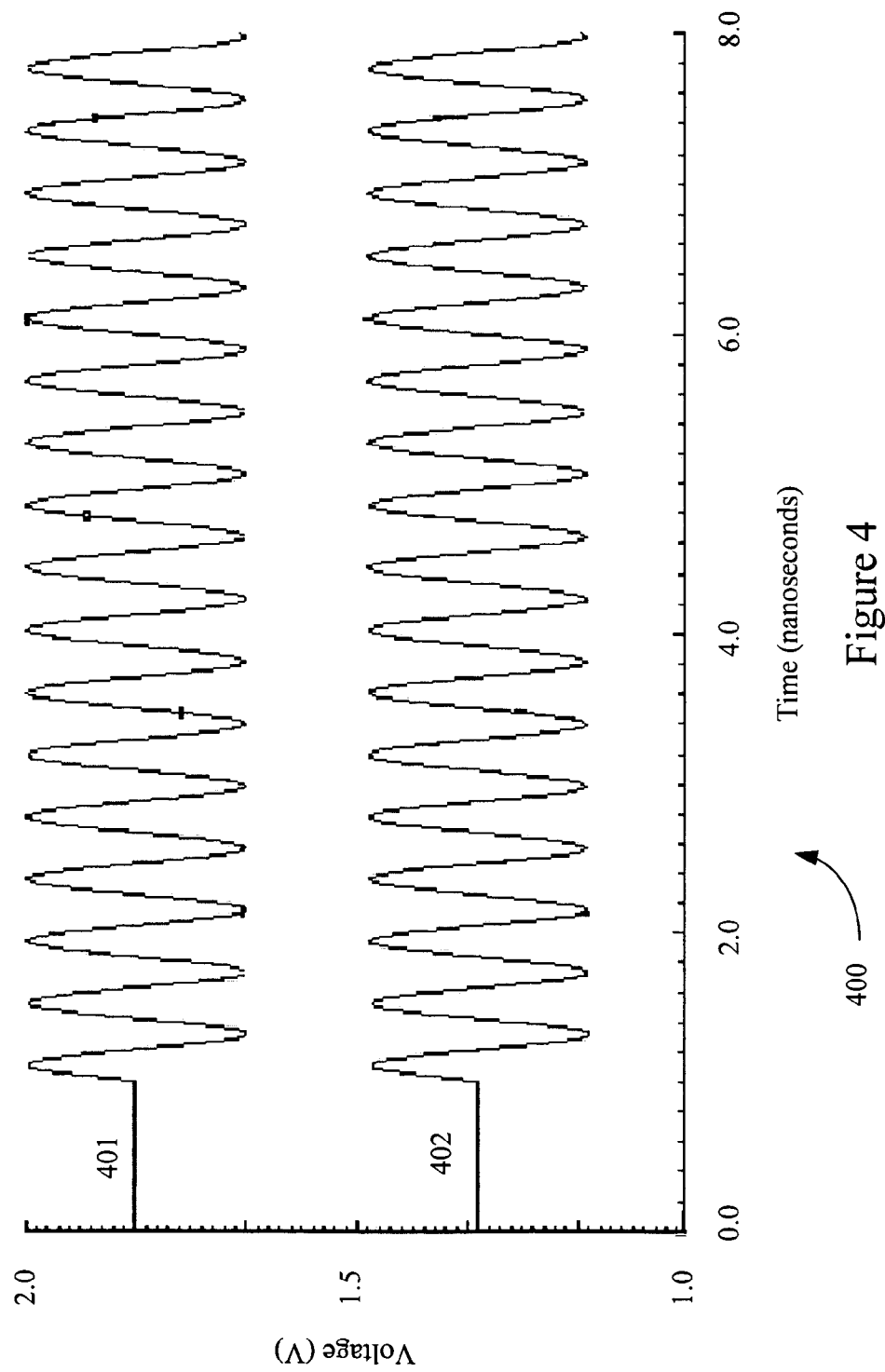
FIG. 4 illustrates the common mode response of the circuit shown in FIG. 2.

FIG. 4 illustrates a graph 400 showing the response of differential peak detector 200 (FIG. 2) when a fully common mode signal is applied to the detector's input terminals. A waveform 401 corresponds to the voltage on node 203, whereas a waveform 402 corresponds to the voltage on node 207. As shown in graph 400, when a common mode signal is applied to differential peak detector 200, both the gate and the source voltages of transistor 202 follow (i.e. increase and decrease together with) the signal. Because the common mode component produces no change in the gate to source voltage of transistor 202, the current through transistor 202 remains constant as does the DC value of node 207. Therefore, no difference appears between the detected signal DET and the reference signal REF.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, although an RC filter (comprising resistor 208 and capacitor 212 in the embodiment shown in FIG. 2) can be used in a differential peak detector, another embodiment could replace that RC filter with an amplifier that amplifies the voltage difference between nodes 207 and 210, wherein the amplifier would have a high frequency attenuation. In one embodiment, the RC filter functionality could be implemented using a low pass filter.

Note that resistor 204, which prevents an RF frequency from being applied to the gate of transistor 205, could be implemented using any appropriate device (e.g. an RF choke, a large inductor).

Further note that transistor 205 could be replaced by a detection circuit that determines the voltage at the source of transistor 202 before a differential signal is applied to the peak detector. This detection circuit could be implemented with an ADC and a register for storing the voltage measured by the ADC.

Further note that differential peak detector 200 can tend to present an unbalanced load to its inputs, i.e. the impedance at the input terminal receiving signal INP can be different than the impedance at the input terminal receiving signal INN. This impedance difference can generate common mode components at the driver. Therefore, in one embodiment, differential peak detector 200 can be replicated with its inputs being switched, i.e. signal INN is provided to capacitor 201 and signal INP is provided to capacitor 206, thereby balancing the impedance at both inputs. Note that in this configuration, shown as a peak detector 500 in FIG. 5, certain components associated with the reference voltage REF can be shared, i.e. transistor 205 and current source 213. Components having the same characteristics and functionalities are labeled with the same reference numbers (e.g. transistors 202A and 202B have the same characteristics and functionalities).

In one embodiment, detected signals DET1 and DET2 can be used individually with respect to the reference signal REF. In another embodiment, a linear combination of detected signals DET1 and DET2 can be compared to reference signal REF.

Figure 5:
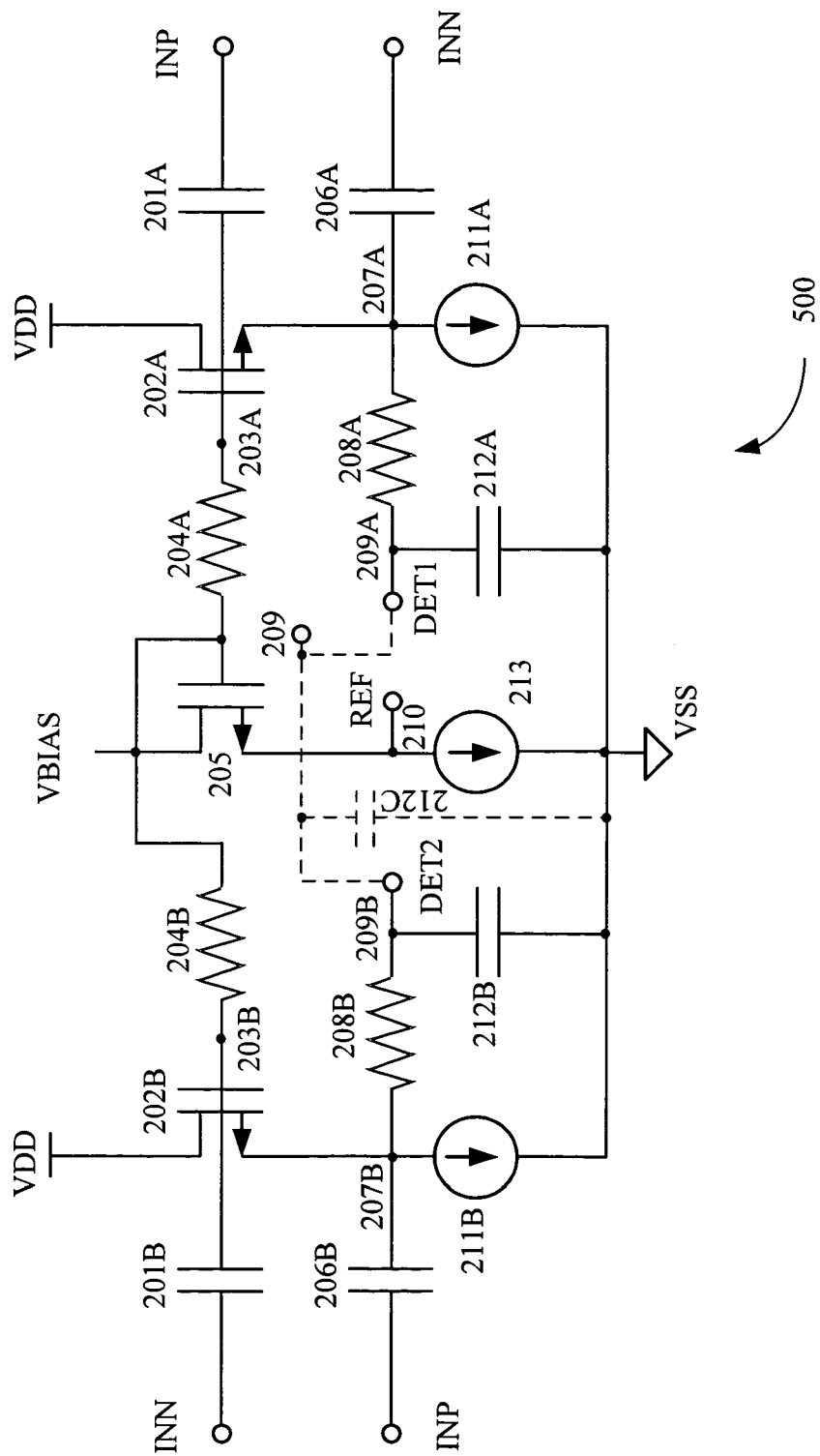
FIG. 5 illustrates another embodiment of a differential peak detector that can balance impedances on its inputs.

In yet another embodiment, detected signals DET1 and DET2 can be averaged by connecting nodes 209A and 209B (see dashed lines in FIG. 5). This configuration advantageously requires minimal filtering and results in higher detection bandwidth. This advantage is possible because the RF signal at nodes 207A and 207B is differential and the common node 209 (connected nodes 209A and 209B) is a virtual ground at the RF frequency. The virtual ground at the RF frequency greatly reduces the capacitance (i.e. provided by capacitors 212A and 212B) necessary to reject ripple at common node 209. In this case, the filter cap would only be necessary to attenuate the common mode components of the RF signals at nodes 207A and 207B for which the combined output would not be a virtual ground. Note that in one embodiment capacitors 212A and 212B can be implemented using a single capacitor 212C coupled between the common node 209 and VSS.

Accordingly, it is intended that the scope of the invention be defined by the following claims and their equivalents.

The invention claimed is:

1. A differential peak detector comprising:
a first transistor having a gate, a drain connected to a first voltage source, and a source connected to a first node;
a first current source connected between the first node and a second voltage source;
a second transistor having a gate and a drain connected to a bias voltage, and a source connected to a second node;
a second current source connected between the second node and the second voltage source;
a first capacitor connected between a first input terminal of the differential peak detector and the gate of the first transistor;
a second capacitor connected between a second input terminal of the differential peak detector and the first node;
a first resistor connected between the gates of the first transistor and the second transistor;
a second resistor connected between the first node and a third node; and
a third capacitor connected between the third node and the second voltage source,
wherein the second node is connected to an output terminal providing a reference voltage, the third node is connected to another output terminal providing a detected voltage, and a difference between the detected voltage and the reference voltage is a peak voltage.

2. A differential peak detector comprising:
a first transistor having a gate, a drain connected to a first voltage source, and a source connected to a first node;
a first current source connected between the first node and a second voltage source;
a second transistor having a gate and a drain connected to a bias voltage, and a source connected to a second node;
a second current source connected between the second node and the second voltage source;
a first capacitor connected between a first input terminal of the differential peak detector and the gate of the first transistor;
a second capacitor connected between a second input terminal of the differential peak detector and the first node;
an impedance device connected between the gates of the first transistor and the second transistor, wherein the impedance device prevents an RF frequency from being applied to the gate of the second transistor;
a filter connected to the first node, the second voltage source, and a third node,
wherein the second node is connected to an output terminal providing a reference voltage, the third node is connected to another output terminal providing a detected voltage, and a difference between the detected voltage and the reference voltage is a peak voltage.

3. The differential peak detector of claim 2, wherein the impedance device includes a resistor.

4. The differential peak detector of claim 2, wherein the filter includes:
a first resistor connected between the first node and the third node; and
a third capacitor connected between the third node and the second voltage source.

5. A differential peak detector comprising:
a first transistor having a gate, a drain connected to a first voltage source, and a source connected to a first node;

a first current source connected between the first node and a second voltage source;

a second transistor having a gate and a drain connected to a bias voltage, and a source connected to a second node;

a second current source connected between the second node and the second voltage source;

a first capacitor connected between a first input terminal of the differential peak detector and the gate of the first transistor;

a second capacitor connected between a second input terminal of the differential peak detector and the first node;

a first impedance device connected between the gates of the first transistor and the second transistor, wherein the first impedance device prevents an RF frequency from being applied to the gate of the second transistor;

a first filter connected to the first node, the second voltage source, and a third node, a third transistor having a gate, a drain connected to the first voltage source, and a source connected to a fourth node;

a third current source connected between the fourth node and the second voltage source;

a third capacitor connected between the second input terminal of the differential peak detector and the gate of the third transistor;

a fourth capacitor connected between the first input terminal of the differential peak detector and the fourth node;

a second impedance device connected between the gate of the third transistor and the bias voltage, wherein the second impedance device prevents the RF frequency from being applied to the gate of the second transistor; and a second filter connected to the fourth node, the second voltage source, and a fifth node, wherein the second node is connected to a first output terminal providing a reference voltage, the third node is connected to a second output terminal providing a detected voltage, and the fifth node is connected to a third output terminal providing another detected voltage.

6. The differential peak detector of claim 5, wherein the first impedance device and the second impedance device are implemented using resistors.

7. The differential peak detector of claim 5, wherein the first filter includes:

a first resistor connected between the first node and the third node; and a fifth capacitor connected between the third node and the second voltage source, and wherein the second filter includes:

a second resistor connected between the fourth node and the fifth node; and a sixth capacitor connected between the fifth node and the second voltage source.

* * * * *